(12) United States Patent
Bergot

(10) Patent No.: US 11,576,014 B2
(45) Date of Patent: Feb. 7, 2023

(54) METHOD FOR TRACKING THE USAGE TIME OF A GENERATOR SET, AUTONOMOUS DEVICE, METHOD OF TRACKING MAINTENANCE, AND THE CORRESPONDING SYSTEM

(71) Applicant: SDMO Industries, Guipavas (FR)

(72) Inventor: Gilles Bergot, Guipavas (FR)

(73) Assignee: Kohler Co., Kohler, WI (US)

( * ) Notice: Subject to any disclaimer, the term of this patent is extended or adjusted under 35 U.S.C. 154(b) by 453 days.

(21) Appl. No.: 16/751,594

(22) Filed: Jan. 24, 2020

(65) Prior Publication Data

US 2020/0244146 A1    Jul. 30, 2020

(30) Foreign Application Priority Data

Jan. 30, 2019  (FR) ...................................... 1900881

(51) Int. Cl.
*H04W 4/38* (2018.01)
*H02K 11/20* (2016.01)
(Continued)

(52) U.S. Cl.
CPC .............. *H04W 4/38* (2018.02); *G01R 31/34* (2013.01); *H02K 7/18* (2013.01); *H02K 11/20* (2016.01);
(Continued)

(58) Field of Classification Search
USPC ......................................................... 702/176
See application file for complete search history.

(56) References Cited

U.S. PATENT DOCUMENTS 5,726,911 A    3/1998  Canada et al.
5,852,351 A   12/1998  Canada
(Continued)

FOREIGN PATENT DOCUMENTS

CN    102707232 A    10/2012
CN    102959484 A     3/2013
(Continued)

OTHER PUBLICATIONS

European Search Report for European Patent Application No. 20154423.6-1010 dated Jun. 4, 2020.
(Continued)

*Primary Examiner* — Paul D Lee
(74) *Attorney, Agent, or Firm* — Lempia Summerfield Katz LLC

(57) ABSTRACT

A method for tracking time in use of a generating set includes furnishing at least one piece of information characteristic of an operating time of said generator set. An autonomous device for measurement is solidly attached to a chassis of said generator set and has at least two sensors. One sensor is for measurement of a first physical magnitude. Another sensor is for measurement of a second physical magnitude. The anonymous device performs analysis of said first and second physical magnitudes provides for delivering a piece of information representative of an operating state of said generator set, determination of a piece of information representative of a global operating time of said generator set by cumulative time during which said representative information of an operating state is furnished, and storage of said piece of information representative of a global operating time of said generator set.

19 Claims, 8 Drawing Sheets

(51) Int. Cl.
*H02K 7/18* (2006.01)
*H04L 67/12* (2022.01)
*G01R 31/34* (2020.01)

(52) U.S. Cl.
CPC .......... *H04L 67/12* (2013.01); *H02K 2211/00* (2013.01)

(56) References Cited

U.S. PATENT DOCUMENTS

| | | | |
|---|---|---|---|
| 10,409,273 B2 * | 9/2019 | Van Gorp | H02J 3/14 |
| 2003/0185103 A1 * | 10/2003 | Rothman | G07C 5/04 368/5 |
| 2004/0139943 A1 | 7/2004 | Kern | |
| 2011/0172966 A1 | 7/2011 | Albsmeier | |
| 2011/0320053 A1 | 12/2011 | Dozier | |
| 2012/0310580 A1 | 12/2012 | Folken | |
| 2014/0152006 A1 | 6/2014 | Sterregaard | |
| 2014/0232539 A1 * | 8/2014 | Hiruta | G07C 5/08 340/438 |
| 2018/0354379 A1 | 12/2018 | Wu | |

FOREIGN PATENT DOCUMENTS

| | | |
|---|---|---|
| CN | 103052890 A | 4/2013 |
| CN | 105008198 A | 10/2015 |
| CN | 107192948 A | 9/2017 |
| CN | 108226777 A | 6/2018 |
| CN | 108919123 A | 11/2018 |
| JP | S5649699 A | 5/1981 |
| RO | 130873 A2 | 1/2016 |

OTHER PUBLICATIONS

Chinese Office Action from Chinese Patent Application No. 202010073775.7, dated Mar. 3, 2022, 17 pages (including English Summary), CN.

* cited by examiner

METHOD FOR TRACKING THE USAGE TIME OF A GENERATOR SET, AUTONOMOUS DEVICE, METHOD OF TRACKING MAINTENANCE, AND THE CORRESPONDING SYSTEM

CROSS REFERENCE TO RELATED APPLICATION

This application claims the benefit of priority to French National Patent Application No. 1900881, filed on 30 Jan. 2019, which is hereby incorporated by reference in its entirety.

1. FIELD

The field of the disclosure is tracking the use and maintenance of generator sets, and in particular portable generator sets intended in particular for occasional or temporary use on any type of site and terrain.

The present disclosure thus finds a use in particular in the field of portable generator sets and more generally mobile systems including means of producing electricity, such as soldering sets or lighting poles. These various systems will hereinafter be known by the term "generator set".

2. PRIOR ART

Portable generator sets have been known for many years. They enable users to have a device for furnishing electricity temporarily or continuously, or for furnishing electricity on any type of site or terrain not supplied with electricity in a fixed manner (construction, camping, harbors, etc.). They can be owned by private individuals or professionals, or used on location by rental equipment companies or made available by equipment leasing companies.

Classically, a generator set includes a chassis on which in particular a engine and an alternator are mounted. The engine, typically a thermal engine, drives the alternator in rotation in such a way as to produce electricity.

The generator sets may require regular maintenance, in accordance with the identified operating times as determined by the manufacturer and mentioned for example in the instruction materials. It is consequently useful to measure the durations of the use, or operation, of a generator set in order to determine when maintenance is necessary.

Hence it is important for the user, or the person responsible for this at the facility, to know these durations and to say in good time when maintenance operations are required and to perform the required maintenance operations, or see that they are performed, in good time. This is necessary in order to guarantee the proper function and the reliability of the generator set.

Certain generator sets, particularly high-capacity sets, are equipped with integrated tracking means (e.g., a tracking device) that measure the presence of an electrical current and/or voltage produced by the generator set, and means for calculating (e.g., a calculator) the corresponding operating times and for managing maintenance. On the other hand, portable generator sets may have such a device.

In fact, especially because of their high cost price, these devices cannot easily be adapted to become portable generator sets that are far less expensive.

Users must therefore make their own estimate of the operating times and thus the times when maintenance is needed. This lack of tracking in any other way than manually is a disadvantage of such portable generator sets because in that case they have only irregular or inadequate upkeep or maintenance, yet to function properly, the generator sets require regular maintenance and upkeep so that their performance and durability, in particular, are unchanged.

Poor tracking of the upkeep of these portable generator sets, which can also be associated with poor handling (impacts, exposure to extreme temperatures, etc.), can lead to faster deterioration of the generator set and hence to a shorter service life than intended, which is not satisfactory.

Furthermore, in addition to the possibility of deterioration of the generator set, irregular maintenance, that is, maintenance not conforming to manufacturers' recommendations, can lead to risks for the users.

Hence there is a need to improve these portable generator sets.

3. SUMMARY

One objective of the present invention is accordingly to at least partially overcome these disadvantages of the prior art.

This objective, as well as others which may become apparent in the course of the present description, are achieved with the aid of
measurement of a first physical magnitude, with the aid of a first of said sensors;
measurement of a second physical magnitude, with the of a second of said sensors;
analysis of said first and second physical magnitudes, delivering a piece of information representative of an operating state of said generator set;
determination of a piece of information representative of a global operating time of said generator set by cumulative time during which said representative information of an operating state is furnished, and
storage of said piece of information representative of a global operating time of said generator set.

Thus the disclosure proposes a novel and inventive approach making it possible to overcome, at least partially, the disadvantages of the prior art.

In particular, such a device enables a user to have tracking of usage time of its or their portable generator sets in a simple and efficient way and thus to perform or cause to perform the maintenance operations required.

It is important to note that the sensors are implemented in an autonomous device, that is, one not connected electrically to the generator set. The autonomous device may be electrically isolated from the generator set. It would in fact be possible to measure the tension or intensity of electrical current produced by the generator set, but the objective in particular may be to avoid any connection of this type, so as to have a simple and inexpensive solution. It is thus provided that an autonomous device is employed, which does not measure the electrical energy produced; instead, it measures phenomena that can be measured at a distance, without contact, and which are representative of an operating state.

Taking into account at least two distinct physical magnitudes makes it possible to produce a reliable piece of information representative of an operating state of said generator set, and in particular information that is resistant to inaccurate detection by one or the other of the sensors resulting from some phenomenon that is not in the set.

Thus the analysis is not perturbed by the outdoor environment in which the generator set is located, an environment in which one of the two measurements could be perturbed and thus make the analysis incorrect.

Consequently, determining a piece of information representative of a global operating time of the generator set is reliable.

In a particular aspect of at least one embodiment, the step of analysis of said first and second physical magnitudes includes the following sub-steps:
- processing of the first magnitude measured;
- comparison of the first magnitude measured relative to a first threshold of predetermined value;
- processing of the second magnitude measured;
- comparison of the second magnitude measured relative to a second threshold of predetermined value, and
- furnishing said piece of information representative of an operating state of said generator set, as a function of said sub-step of comparison of the first magnitude measured relative to a first threshold of predetermined value and of said sub-step of comparison of the second magnitude measured relative to a second threshold of predetermined value, if said first magnitude and said second magnitude are respectively higher than said first and second thresholds.

Thus, when at least one of the measurements is below the associated threshold, the set is not considered to be in operation. In other words, one considers that if only one of the measurements is higher than the threshold, this signifies that the phenomenon detected, although real, is not produced by the set and hence the set is not in operation.

The information representative of an operating state of said generator set is reliable, and it takes into account the first and second magnitudes measured.

In a particular embodiment, said first physical magnitude is representative of the operation of a engine of said generator set, and that said second physical magnitude is representative of the operation of an alternator of said generator set.

Thus the functioning of two major elements of the generator set is detected, which makes it possible to detect operation reliably. The operation of the engine can be detected for example especially by taking into account the vibrations it generates, and the operation of the alternator can be detected for example based on the electromagnetic field that it produces.

In a particular aspect of at least one embodiment, the method further includes a step of transmission of said piece of information characteristic of a global operating time, from said autonomous device to a data processor (e.g., data processing means), when said autonomous device is connected to said data processing means.

In that case, the step of transmitting said piece of information characteristic of a global operating time can also include a sub-step of transmission of at least one system piece of information about said generator set, such as to identify said generator set, said system information belonging to the set including:
- a serial number of the generator set;
- localization data of said generator set, or
- a model of the generator set.

This makes it possible to have a complementary piece of information making it possible for example to optimize maintenance and tracking, especially in the case of tracking a plurality of portable generator sets.

In a particular characteristic of at least one embodiment, the method includes a preliminary step of coupling said autonomous device with said data processing means.

Accordingly, this makes it possible to prevent a third party from being able to connect and recover the data, whether intentionally or not.

The disclosure also relates to an autonomous device employing a method of one of the embodiments mentioned above.

The disclosure furthermore relates to a method including the following steps:
- reception of a piece of information characteristic of a global operating time by an autonomous device;
- processing of said piece of information characteristic of a global operating time, furnishing at least one piece of information relating to the maintenance of said generator set, as a function of the operating time of the generator set.

Thus it is this communication device (telephone, tablet, computer, etc.) or server that analyzes the operating times and determines whether maintenance must be performed or not. The autonomous device may compile an operating time and furnishing it to a distant element that uses it.

Such a method also makes it possible, efficiently and simply, to perform tracking of the global operating time of a generator set and of maintenance operations to be performed, or to cause them to be performed.

In a characteristic of at least one embodiment, said at least one piece of information relating to maintenance said at least one piece of information relating belongs to the set including:
- a number of total hours of use of the generator set;
- a number of continuous hours of use of the generator set;
- a date of initial use of the generator set;
- a date of final use of the generator set;
- autonomy of the generator set;
- a requirement to start the generator set;
- a requirement to stop the generator set;
- a recommendation to use the generator set, or
- a requirement, a request, or a need to perform maintenance of said generator set.

In another aspect of at least one embodiment, the method further includes a step of transmission of at least one maintenance datum from the processing means to said autonomous device.

Because of this, the method can for example enable making updates of the operations performed on the generator set or of the various data furnished by the user, which may prove to be important for the autonomous device.

In that case, the at least one maintenance datum transmitted from said processing means to said autonomous device can belong to the set including:
- an update of a maintenance book for the generator set;
- a date of maintenance performed;
- a serial number;
- a maintenance plan to be carried out;
- a user datum;
- a command for reinitialization of said piece of information representative of a global operating time.

In a feature of at least one embodiment, said processing means include an external terminal, and that said method includes at least one step among the following:
- a step of displaying at least one datum among said at least one maintenance datum said system information for said generator set, said at least one piece of information characteristic of a global operating time, and
- a step of receiving instructions of a user interacting with said external terminal. The data processor may be in communication with the external terminal.

Thus a user has a visual at his disposal that shows the data relating to his or her generator sets and also of interacting in particular with the tracking of the maintenance of the generator set.

In other words, this enables communicating the information about a generator set to a user and also enables the user to communicate the information.

The disclosure further relates to a computer program product that can be remotely charged from a communication network and/or is stored on a support that is readable by microprocessor and/or executable by a microprocessor, characterized in that it includes programming code instructions for executing a maintenance method of a generator set of one of the aforementioned embodiments, when it is performed on a computer.

In addition, a computer-readable, nonvolatile storage medium that stores a computer program including a set of instructions executable by a computer or a processor in order to implement the method of one of the aforementioned embodiments.

Finally, a system includes:
 a generator set;
 an autonomous device for tracking the usage time of a generator set, affixed to said generator set, and
 data processing means capable of implementing a method for tracking the maintenance of a generator set of one of the aforementioned embodiments.

In one embodiment, the system includes a server linked to said data processing means in such a way as to store at least a portion of the information relating to the maintenance of said generator set.

4. BRIEF DESCRIPTION OF THE DRAWINGS

Further characteristics and advantages of the invention will become more apparent from reading the following description of a particular embodiment, given by way of a simple illustrative and non-limiting example, and the appended drawings, in which.

The term "autonomous" signifies here that the device is neither supplied electrically by the generator set nor is it connected electrically to it, for example to produce a current or voltage. This intrusive approach is certainly one possibility for gaining knowledge of the operation, but employing it could be relatively complex and expensive and poorly adapted to portable generator sets.

This autonomous device 2 is for example placed in proximity with the engine and the alternator, in such a way as to facilitate sensing signals emitted by these elements. More particularly, such proximity makes it possibility to have tracking that is relatively precise and reliable, and for which the outdoor environment has a reduced impact on the data collected.

The autonomous device 2 for tracking the usage time for generator set 9 is capable of furnishing at least one characteristic piece of information of an operating time of this generator set 9.

To do so, the autonomous device 2 has at least two sensors enabling measurement of at least two physical magnitudes.

In the embodiment shown, the two physical magnitudes measured are the presence of a magnetic field generated by the alternator of the generator set and the presence of vibration generated by the engine of the set.

More particularly, a first sensor is a magnetic sensor capable of showing the presence of a magnetic field generated by the alternator of the generator set.

The first physical magnitude measured by this first sensor can thus be representative of the rotation of the alternator of the generator set, which is a relatively strong parameter because the difference between the magnetic field generated by the alternator when it is in operation and is not in operation is substantial.

In fact, the difference in the pickup of the value of the magnetic field generated by the alternator is very important as to whether the alternator is off or is in operation.

Figure 1:
FIG. 1 is a perspective view of a generator set including an autonomous device that implements a method for tracking usage time of the generator set in one embodiment.
Figure 2:
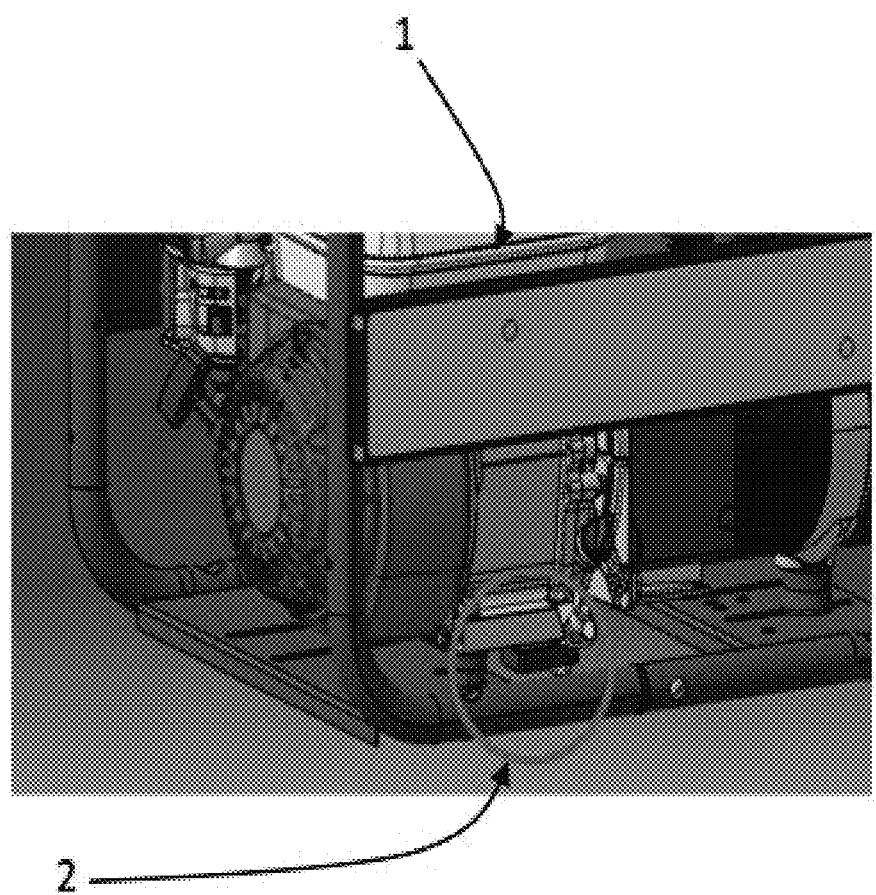
FIG. 2 is a perspective view of a portion of a generator set, without the side cover, including an autonomous device implementing a method for tracking usage times in accordance with the embodiment of FIG. 1.

The fact that the autonomous device 2 is located in proximity with the alternator, as shown in FIGS. 1 and 2, also makes it possible to obtain reliable pickups of this first physical magnitude.

A second sensor is a vibration sensor capable of sensing the vibrations generated by the engine of the generator set 1. Such a sensor enables detecting the vibrations of the engine when it is in operation.

Thus this autonomous device 2 employs a method for tracking the usage time of the generator set 1, this method being capable of furnishing at least one characteristic piece of information of an operating time of the generator set 1.

Figure 4:
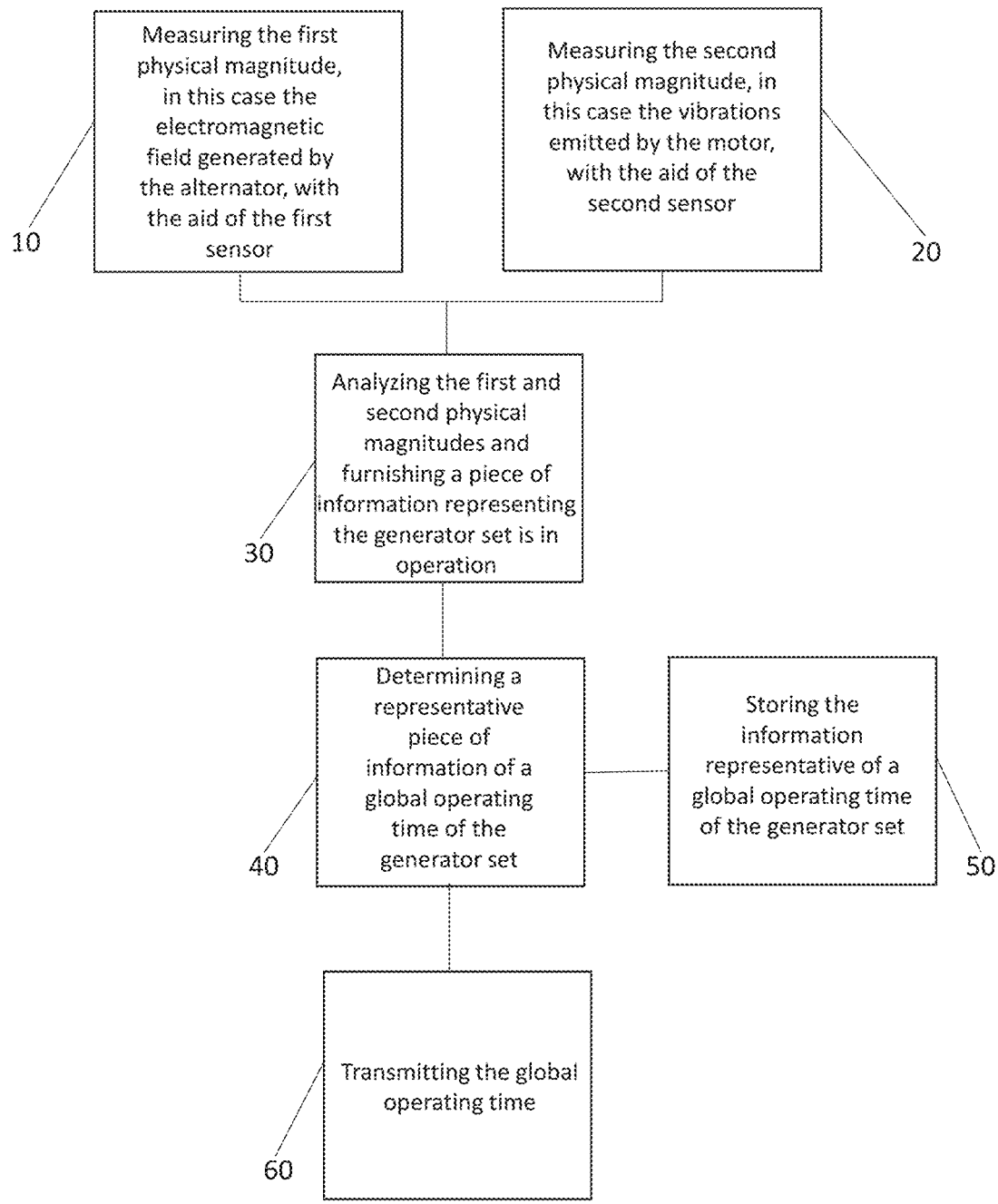
FIG. 4 is a diagram illustrating a method for tracking the operating time, in one embodiment.

According to the invention, the method, shown in FIG. 4, includes the following steps:
 a step 10 of measuring the first physical magnitude, in this case the electromagnetic field generated by the alternator, with the aid of the first sensor;
 a step 20 of measuring the second physical magnitude, in this case the vibrations emitted by the engine, with the aid of the second sensor;
 a step 30 of analysis of the first and second physical magnitudes, furnishing a piece of information representing the fact that the generator set 1 is in operation;
 a step 40 of determining a representative piece of information of a global operating time of the generator set 1, by the cumulative time over which the information representative of an operating state is furnished, and
 a step 50 of storing the information representative of a global operating time of the generator set 1.

Once the first and second magnitudes have been measured, the analysis step 30 makes it possible to furnish a piece of information representative of an operating state of the generator set 1, that is, in particular defining whether the generator set 1 is in operation or at a stop at the moment of the measurements.

Figure 5:
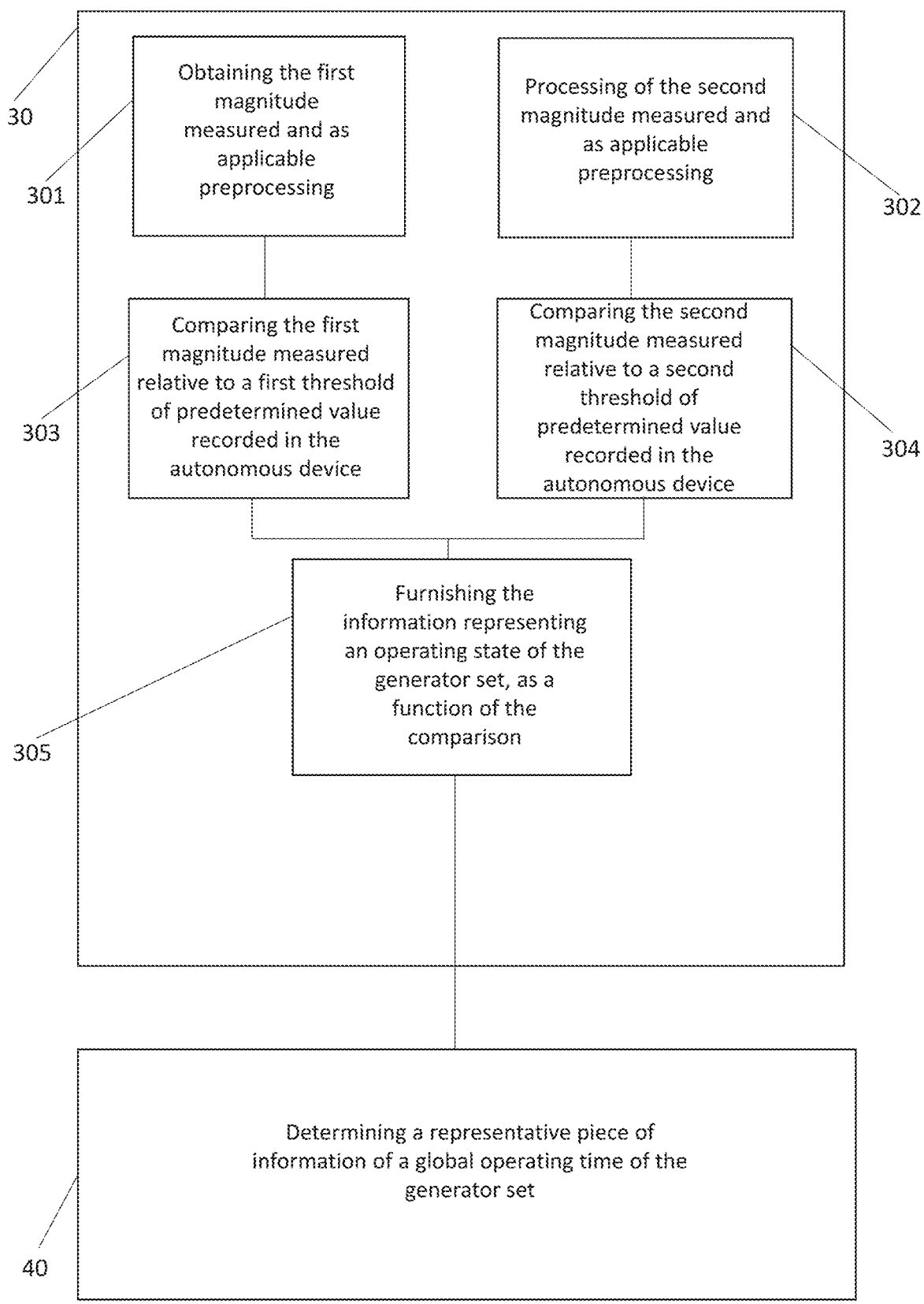
FIG. 5 is a diagram illustrating in detail the step of analyzing the tracking method of the embodiment of FIG. 4.

To do so, the analysis step 30 of the first and second physical magnitudes includes for example the following sub-steps, as illustrated in FIG. 5:
 obtaining (301) the first magnitude measured and as applicable preprocessing (filtering, smoothing, etc.);

comparing (303) the first magnitude measured relative to a first threshold of predetermined value recorded in the autonomous device;

processing (302) of the second magnitude measured and as applicable preprocessing (filtering, smoothing, etc.);

comparing (304) the second magnitude measured relative to a second threshold of predetermined value recorded in the autonomous device, and furnishing (305) the information representing an operating state of the generator set, as a function of the sub-step of comparison (303) of the first magnitude measured relative to a first threshold of predetermined value, and the sub-step of comparison (304) of the second magnitude measured relative to a second threshold of predetermined value, if the first magnitude and the second magnitude are respectively higher than the first and second thresholds.

Thus if the first magnitude is higher than the first threshold of predetermined value, and if the second magnitude is higher than the second threshold of predetermined value, in that case the generator set is considered to be in operation, and the information representing an operating state of the generator set is furnished.

In other words, the generator set is considered to be in operation when the two sensors measure physical magnitudes with parameters indicating potential operation, that is, when the engine and the alternator of the generator set are in operation.

In this embodiment, the first threshold is equivalent to 5 µT (microtesla).

More generally, the first threshold is between 25 µT and 450 µT.

Furthermore, and also in this embodiment, the first threshold is equivalent 10 Hz (hertz).

More generally, the first threshold can be between 20 Hz and 200 Hz.

The fact of having a first sensor and a second sensor available makes it possible to furnish a piece of piece of information characteristic of an operating state that is reliable, for example not having any perturbation of the outdoor environment in which the generator set is placed.

In fact, on the hypothesis that the generator set is located in an environment that has a strong magnetic field, the measurements of the first physical magnitude done by the first sensor can be perturbed. Nevertheless, by recouping using the measurements of the second physical magnitude done by the second, vibration, sensor, picking up a magnetic field when the generator set is not in operation is not identified as an operation of the generator set, because the second sensor does not sense vibration from the engine.

This is the case also on the hypothesis where the vibrations are produced at the level of the generator set, for example when it is being transported. In that case, the measurements of the second physical magnitude done by the second sensor can be perturbed because of the vibrations, caused for example by irregularities of the roadway while the generator set is being transported. Nevertheless, by recouping, with the measurements of the first physical magnitude done by the first, magnetic field, sensor, detecting vibrations when the generator set is not in operation is not identified as an operation of the generator set, because the first sensor then does not pick up any magnetic field at the alternator.

Thus, based on the analysis of connected physical magnitudes, in this case the magnetic field emitted by the alternator and the vibrations emitted by the engine, the method then, in the step of analysis 30 of the first and second physical magnitudes, furnishes a piece of piece of information characteristic of an operating state of the generator set that is reliable.

It should be noted that, in other embodiments, it can be provided that the first physical magnitude and second physical magnitude are of different types, and hence the first sensor and the second sensor are of different types. It is also possible to take more than two types of sensor into account.

For example, a temperature sensor, for instance for sensing the engine temperature, can be employed. The engine temperature may be measured an engine block, a coolant, or an oil reservoir.

A voltage sensor could be provided on poles that hold elements of the generator set.

An acoustic sensor can also be provided, for example in order to evaluate the sonic volume (and/or other sonic characteristics) generated by the engine and/or by the rotation of the alternator.

Additionally, an oil pressure sensor, a speed sensor for the rotation of the alternator, or an air flux sensor may be provided.

Furthermore, the processing presented here by way of example, employing a comparison of the signals measured at the predetermined thresholds, can be replaced by some other processing, analyzing the two signals in greater precision, for example at the base of filters or mathematical transformations, in order to determine that the generator set is in operation as accurately as possible.

The thresholds can be predetermined, in a way adapted to each type of generator sets, or calibrated in a precise manner for each set, at the moment of its manufacture, or again updated periodically, for example during maintenance procedures.

As shown in FIGS. 4 and 5, and as mentioned above, the method further includes a step 40 of determining a piece of information representative of a global operating time of the generator set 1, according to the cumulative time while the information representative of an operating state is finished.

In other terms, if the piece of information that is characteristic of an operating state of the generator set is furnished, the information representative of a global operating time of the generator set is incremented by a given time unit (e.g., predetermine amount of time).

On the other hand, if the information that is characteristic of an operating state of the generator set is not delivered, the information representative of a global operating time of the generator set is not incremented by a piece of time unit information (e.g., predetermine amount of time) and thus remains invariable.

For example, if this information representative of a global operating time of the generator set is zero, which corresponds to a generator set that is not in operation, it remains zero.

Figure 7:
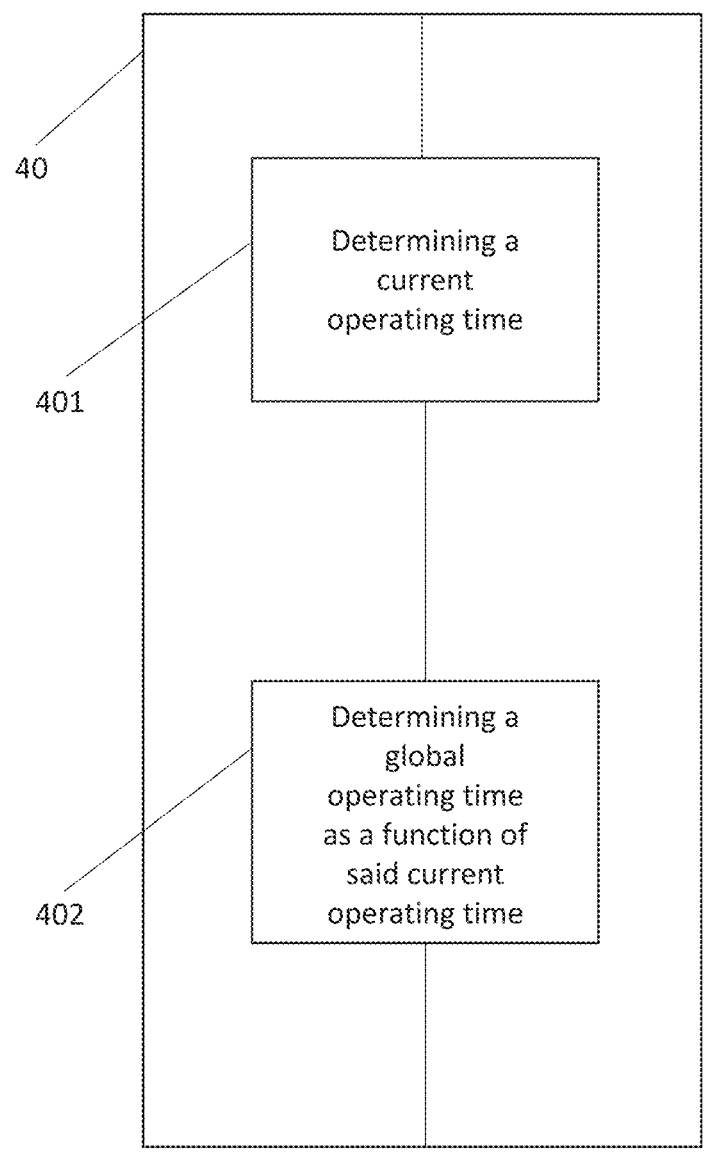
FIG. 7 is a diagram illustrating in detail the step of determining the tracking method of the embodiment of FIG. 4.
Figure 8:
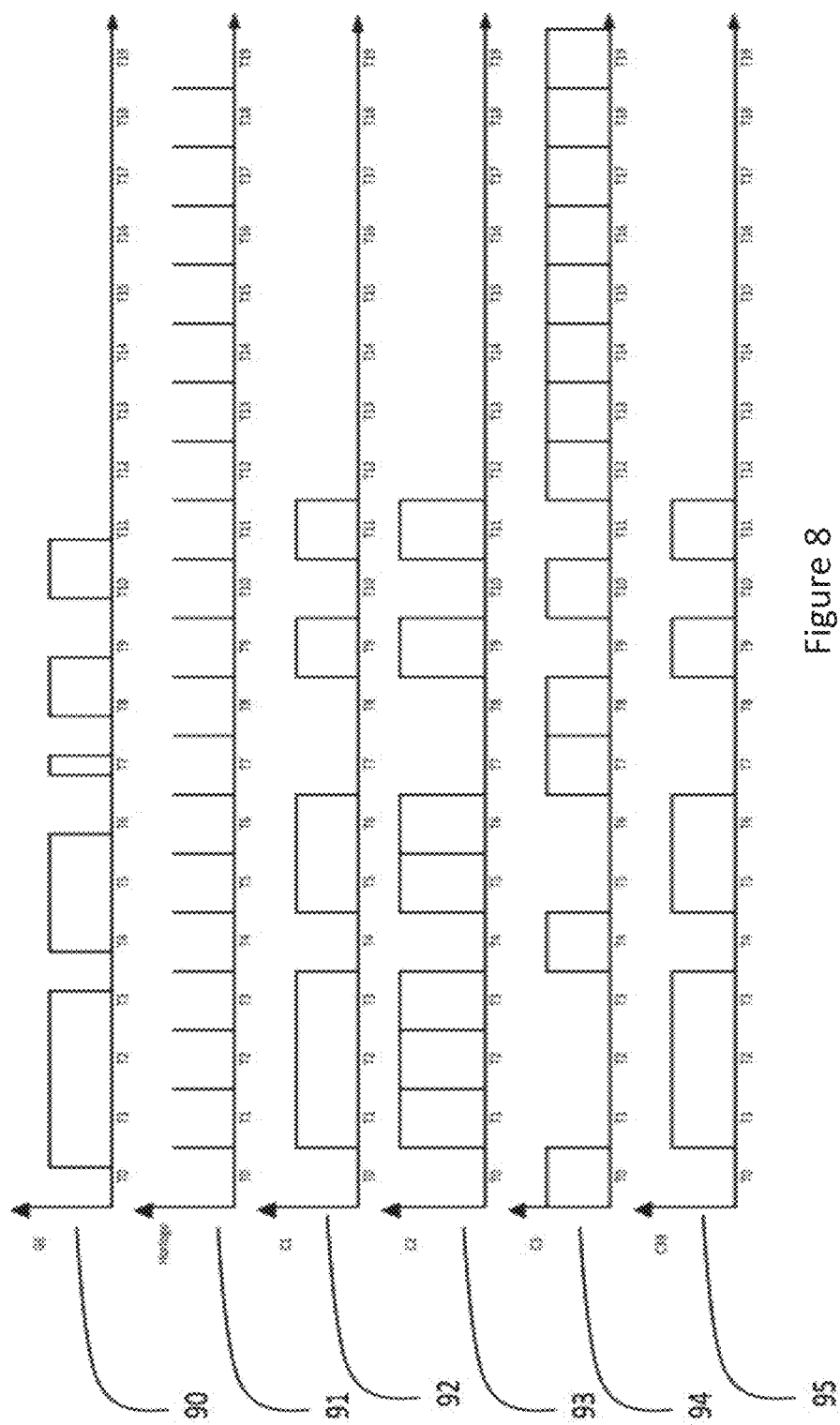
FIG. 8 is a logic chart showing various embodiments for counting the operating time of the generator set.

For explaining again the determination of the information representative of a global operating time, examples of particular embodiments of the step 40 of determination will now be presented, with reference to FIGS. 7 and 8.

As shown in FIG. 7, in this embodiment, the step 40 of determination includes the following sub-steps:

sub-step 401 of determining a current operating time;

sub-step 402 of determining a global operating time as a function of said current operating time.

FIG. 8 illustrates there different modes of tallying the current operating time of the generator set. In FIG. 8, the graphic 90 illustrates the periods when the generator set is effectively in operation.

The graphic 91 illustrates, by pulses, the instants when the step of analysis of the first and second physical magnitudes is performed.

Three different modes of tallying the current operating time of the generator set are thus illustrated, and consequently the tallying of the global operating time of the generator set as well.

In the tallying mode of the graphic 92, the counter takes a function of the generator set into account as soon as the analysis provides a piece of information representative of the operating state of the generator set and stops taking the function into account if the analysis step no longer delivers this representative information.

In the tallying mode of the graphic 93, the counter takes a function of the generator set into account as soon as the analysis furnishes a piece of information representative of the operating state, and finds that the set is in operation during the interval between two successive analysis steps.

The tallying mode in the graphic 94 is the opposite of the tallying mode of the graphic 92. In that case, in order to have the current operating time, it is necessary to obtain the inverse, as shown by the graphic 95.

When the step 50 of storing the information representative of a global operating time of the generator set 1 occurs, this information is stored in a memory of the autonomous device.

In the embodiment of the method for tracking the usage time of the generator set 1 illustrated in FIG. 4, the method further includes a step of transmission 60 of the piece of information characteristic of a global operating time from the autonomous device 2 to the data processing means 3, when the autonomous device 2 is connected to the data processing means 3 (e.g., data processor).

In order to connect the autonomous device 2 to the data processing means 3, the method, in this embodiment, includes a preliminary step of coupling the autonomous device 2 to the data processing means 3.

Such a step makes it possible to have a reciprocal authentication of the processing means and of the autonomous device; this makes the data secure. Thus a third party cannot gain access to the data without having performed a prior coupling.

This step of transmitting the information can, for example, be based on a technology known as Bluetooth Low Energy (BLE).

A transmission step based on an NFC, Zigbee, Bluetooth, Zwave, WiFi, LoRa, Sigfox technology as well as the mobile cell networks or low-power radio networks can also be provided. The autonomous device 2 and data processor 3 may be connected via a low power radio network. In particular, the autonomous device and the processing means are able to communicate via protocols intended for the "internet of things".

In one embodiment, the step of transmission of the piece of information characteristic of a global operating time, from the autonomous device to the data processing means, can be done automatically as soon as the data processing means and the autonomous device are able to be connected to one another automatically. In other words, the exchange of data can be done at the request of the user, who launches a dedicated application and/or a command to interrogate this application, or does so automatically. In this last case, the application can rotate constantly as a basic task in order to enter into contact with the autonomous device as soon as that device is in proximity. In a variant, the autonomous device can itself enter into communication with an adapted device or server, for example if an available network is detected, with the aid of a protocol adapted for the "internet of things".

This step 60 of transmitting characteristic information about a global operating time also, in this embodiment, includes a sub-step of transmission of at least one piece of system information about the generator set 1 in such a way as to identify the particular generator set.

One such sub-step is of interest in the case for example of a parking lot for generator sets, so as to identify which generator set the piece of information characteristic of a global operating time corresponds to.

One such piece of system information can for example be the following:
   a serial number of the generator set;
   data for the location of the generator set, or
   a model of the generator set.

Because of this, it can be provided that the autonomous device has geolocation means. This allows the administrator to know precisely where each generator set is located, and for example to monitor that it is indeed where it is supposed to be. This is also a possible aid in the event that the generator set is lost or stolen.

An embodiment can also be provided in which the step 60 of transmitting the piece of information characteristic of a global operating time also includes a sub-step of transmission of other data, such as:
   detecting shocks at the generator set;
   a power profile emitted by the generator set;
   an excess charge (e.g., overcharging) of the generator set, or
   an insufficient charge (e.g., undercharging) of the generator set.

Figure 3:
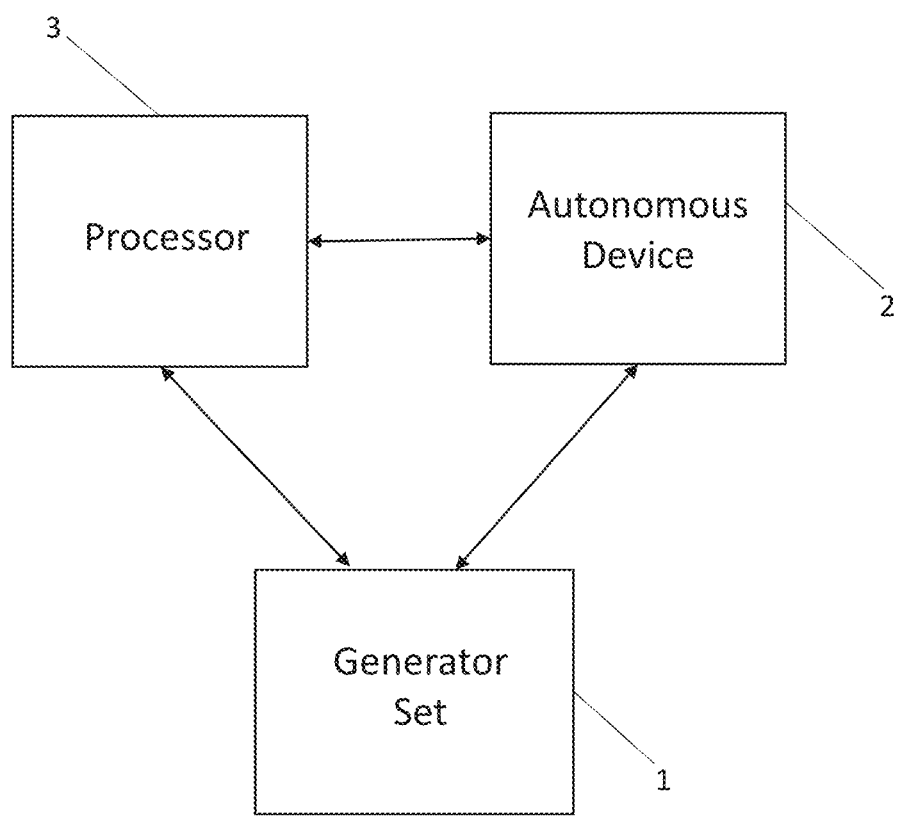
FIG. 3 is a diagram illustrating a system in one embodiment.

In one aspect of the invention, illustrated in particular by FIG. 3, the generator set 1, the autonomous device 2 for tracking the usage time, and the data processing means form a system making it possible to have tracking of the usage time of the generator set 1 but also tracking of the maintenance of this generator set 1.

This tracking of the maintenance of the generator set 1 is more particularly done in collaboration with the data processing means that are capable of employing a method for tracking the maintenance of the generator set.

Figure 6:
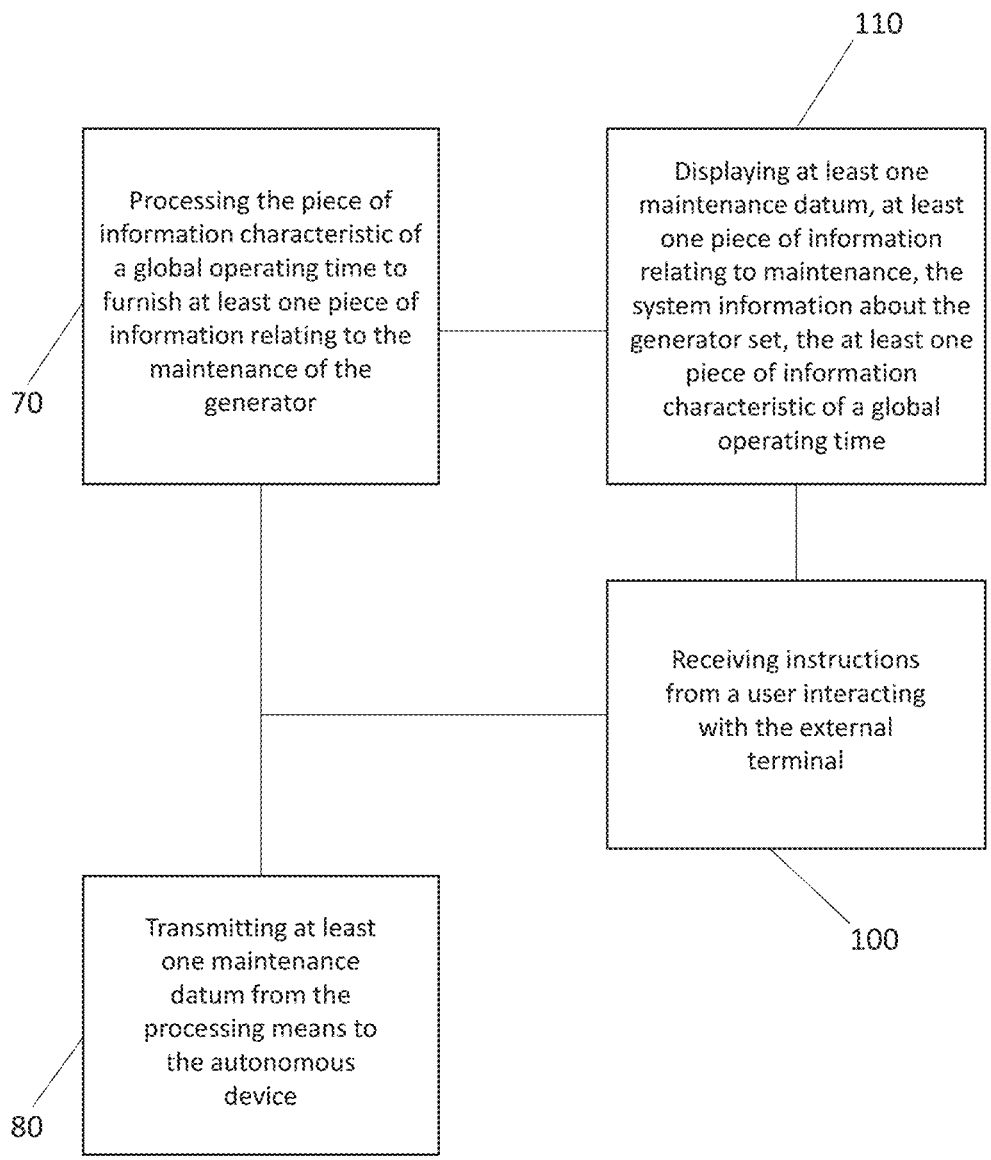
FIG. 6 is a diagram illustrating a method for tracking the maintenance of a generator set in one embodiment.

Thus in the method for tracking the maintenance of the generator set 1, illustrated particularly in FIG. 6, when the processing means receive a piece of information characteristic of a global operating time via the autonomous device 2, the method includes a step 70 of processing the piece of information characteristic of a global operating time by the data processing means 3, in such a way as to furnish at least one piece of information relating to the maintenance of the generator set 1, as a function of the operating time thereof.

In other words, the processing means 3 analyze the piece of information characteristic of a global operating time transmitted via the autonomous device 2 in order to furnish at least one piece of information relating to the maintenance of the generator set 1.

One such piece of information relating to the maintenance may be, in this embodiment:
   a total number of hours of use of the generator set;
   a number of continuous hours of use of the generator set;
   a date of initial use of the generator set;
   a date of the most recent use of the generator set;
   autonomy of the generator set;
   a requirement to start the generator set;
   a requirement to stop the generator set;
   a recommendation to use the generator set, or
   the need to perform maintenance of said generator set.

This information relating to the maintenance can, for example, be communicated to a user by way of an external terminal included in the processing means 3.

This external terminal can for example be a smartphone or tablet, making it possible to display information relating to the maintenance but also permitting a user to give instructions.

More particularly, in this embodiment, the method includes at least one step among these:
- a step 110 of displaying at least one maintenance datum, at least one piece of information relating to maintenance, the system information about the generator set 1, the at least one piece of information characteristic of a global operating time, and
- a step 100 of receiving instructions from a user interacting with the external terminal.

It should be noted that the system can furthermore include a server that is linked to the data processing means 3 in such a way as to store at least partially the information relating to the maintenance of the generator set.

It can also be provided, in one embodiment, that the server also stores at least one maintenance datum, at least one piece of information relating to the maintenance, the system information about the generator set 1, or the at least one piece of information characteristic of a global operating time.

In the embodiment illustrated particularly in FIG. 6, following the display step 110 and the step 100 of receiving instructions from the user interacting with the external terminal, with the intention of entering maintenance data, the method further includes a step 80 of transmitting at least one maintenance datum from the processing means 3 to the autonomous device 2.

A maintenance datum of this kind transmits from the processing means 3 to the autonomous device 2 belonging to the set including:
- an update of a maintenance book for the generator set;
- a date of maintenance performed;
- a serial number;
- a maintenance plan to be carried out;
- a user datum;
- a command for reinitialization of said piece of information representative of a global operating time.

In other words, following the display step, the user can make measurements, as a function of the displayed datum, and then interact with the external terminal in the step 100 of receiving instructions.

For example, in the case of displaying a need to perform maintenance of the generator set, the user performs the maintenance of the generator set and then, when the maintenance has been done, enters a date for maintenance performed, this date being transmitted in the step 80 of transmission of at least one maintenance datum from the processing means 3 to the autonomous device 2.

Such a step makes it possible to update the autonomous device 2 in the same way as the processing means 3, in such a way that the tracking of the maintenance of the generator set is optimal.

The invention also relates to a computer program product that can be remotely charged from a communications network and/or is stored on a microprocessor-readable support and/or is executable by a microprocessor, including program code instructions for executing a maintenance procedure for a generator set in one of the embodiments cited above, when the method is performed on a computer.

The invention also relates to a computer-readable and nonvolatile storage medium that stores a computer program that includes a set of instructions that can be executed by a computer or processor in order to implement the maintenance procedure for a generator set in accordance with one of the embodiments cited above.

More particularly, the storage medium can be included in the server that is linked to the data processing means.

One or more generator sets may provide power to a load through a generator bus. The generator bus is an electrically conductive path and may be selectively connected through multiple circuit breakers or other types of switches to the generators, the utility system, and other devices.

The phrases "coupled with" or "coupled to" include directly connected to or indirectly connected through one or more intermediate components. Additional, different, or fewer components may be provided. Additional, different, or fewer components may be included.

The data processor (processing means 3) may include a general processor, digital signal processor, an application specific integrated circuit (ASIC), field programmable gate array (FPGA), analog circuit, digital circuit, combinations thereof, or other now known or later developed processor. The processor may be a single device or combinations of devices, such as associated with a network, distributed processing, or cloud computing.

The data processor may include a memory that is a volatile memory or a non-volatile memory. The memory may include one or more of a read only memory (ROM), random access memory (RAM), a flash memory, an electronic erasable program read only memory (EEPROM), or other type of memory. The memory may be removable from the network device, such as a secure digital (SD) memory card.

In addition to ingress ports and egress ports, a communication interface of the controller may include any operable connection. An operable connection may be one in which signals, physical communications, and/or logical communications may be sent and/or received. An operable connection may include a physical interface, an electrical interface, and/or a data interface.

The communication interface may be connected to a network. The network may include wired networks (e.g., Ethernet), wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

An input device may receive user inputs for thresholds and time periods. The input device may include a button, a switch, a keypad, a touchscreen, a key, an ignition, or other structure configured to allow a user to enter data or provide a command to operate the engine. The input device may include a connection to a network, a smartphone, a tablet, a personal computer configured to electronically transmit the command to the engine. The communication may be wireless or wired (e.g., received by the communication interface).

While the computer-readable medium (e.g., memory) may be a single medium, the term "computer-readable medium" includes a single medium or multiple media, such as a centralized or distributed database, and/or associated caches and servers that store one or more sets of instructions. The term "computer-readable medium" shall also include any medium that can store, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Processors suitable for the execution of a computer program include, by way of example, both general and special purpose microprocessors, and anyone or more processors of any kind of digital computer. Generally, a processor may receive instructions and data from a read only memory or a random access memory or both. The essential elements of a computer are a processor for performing instructions and one or more memory devices for storing instructions and data. Generally, a computer may also include, or be operatively coupled to receive data from or transfer data to, or both, one or more mass storage devices for storing data, e.g., magnetic, magneto optical disks, or optical disks. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

The invention claimed is:

1. A method for tracking usage time of a generator set, the method comprising:
receiving first measurement data for a first physical magnitude collected by a first sensor;
receiving second measurement data for a second physical magnitude collected by a second sensor, wherein the second physical magnitude is an electromagnetic field representative of the operation of an alternator of the generator set;

providing, based on the first physical magnitude and the second physical magnitudes, data for an operating state of the generator set;

determining, by an autonomous device, a global operating time of the generator set by a cumulative time during which the data for the operating state is provided, wherein the autonomous device is attached to a chassis of the generator set and includes the first sensor and the second sensor; and storing the global operating time of the generator set.

2. The method of claim 1, wherein providing the operating state of the generator set further comprises:

processing the first magnitude measured;

comparing the first magnitude measured relative to a first threshold of predetermined value;

processing the second magnitude measured;

comparing the second magnitude measured relative to a second threshold of predetermined value, and providing operating state of the generator set, as a function of the comparison of the first magnitude measured relative to a first threshold of predetermined value and the comparison of the second magnitude measured relative to a second threshold of predetermined value, when the first magnitude and the second magnitude are respectively higher than the first and second thresholds.

3. The method of claim 1, wherein the first physical magnitude is representative of the operation of a motor of the generator set.

4. The method of claim 1, further comprising:

transmitting the global operating time from the autonomous device to a data processor, wherein the autonomous device is connected to the data processor.

5. The method of claim 4, further comprising:

transmitting supplemental information associated with the global operating time from the autonomous device to the data processor.

6. The method of claim 5, wherein the supplemental information includes one or more of:

a serial number of the generator set;

localization data of the generator set, or a model of the generator set.

7. The method of claim 4, further comprising:

coupling the autonomous device with the data processor.

8. The method of claim 7, wherein the autonomous device and the data processor are connected via a low power radio network.

9. A method of tracking maintenance of a generator set, in a device communicating with a server, the method comprising:

receiving of a piece of information characteristic of a global operating time by an autonomous device, wherein the piece of information characteristic of the global operating time is based on a measurement of a magnetic field of an alternator of the generator set;

performing analysis, at a data processor, of the piece of information characteristic of a global operating time; and furnishing at least one piece of information relating to the maintenance of the generator set, as a function of the operating time of the generator set.

10. The method of claim 9, wherein the at least one piece of information relating to the maintenance of the generator set includes one or more of:

a number of total hours of use of the generator set;

a number of continuous hours of use of the generator set;

a date of initial use of the generator set;

a date of final use of the generator set;

autonomy of the generator set;

a requirement to start the generator set;

a requirement to stop the generator set;

a recommendation to use the generator set, or a requirement to perform maintenance of the generator set.

11. The method of claim 9, further comprising:

transmitting at least one maintenance datum from the data processor to the autonomous device.

12. The method of claim 11, wherein the at least one maintenance datum transmitted from the data processor to the autonomous device belongs to the generator set including one or more of:

an update of a maintenance book for the generator set;

a date of maintenance performed;

a serial number;

a maintenance plan to be carried out;

a user datum; or a command for reinitialization of the global operating time.

13. The method of claim 11, wherein the data processor includes an external terminal.

14. The method of claim 13, further comprising:

displaying at least one datum among the at least one maintenance datum for the generator set.

15. The method of claim 13, further comprising:

receiving instructions of a user interacting with the external terminal.

16. A system including:

a generator set;

an autonomous device for tracking the usage time of a generator set, the autonomous device coupled to the generator set and providing first measurement data for a first physical magnitude from a first sensor and second measurement data for a second physical magnitude from a second sensor, wherein the second physical magnitude is an electromagnetic field representative of the operation of an alternator of the generator set; and a data processor configured to track maintenance of the generator set based on a global operating time of the generator according to the first measurement data and the second measurement data.

17. The system of claim 16, wherein the first measurement data is representative of the operation of a motor of the generator set.

18. The system of claim 16, further comprising:

a radio network for connecting the data processor to the autonomous device.

19. The system of claim 16, further comprising:

a server linked to the data processor in such a way as to store at least a portion of data relating to the maintenance of the generator set.

* * * * *